United States Patent [19]

Toyooka et al.

[11] Patent Number: 4,662,062
[45] Date of Patent: May 5, 1987

[54] METHOD FOR MAKING BIPOLAR TRANSISTOR HAVING A GRAFT-BASE CONFIGURATION

[75] Inventors: Tetsuo Toyooka, Nagaokakyo; Masatoshi Shiraishi, Kyoto, both of Japan

[73] Assignee: Matsushita Electronics Corporation, Kadoma, Japan

[21] Appl. No.: 703,539

[22] Filed: Feb. 20, 1985

[30] Foreign Application Priority Data

Feb. 20, 1984 [JP] Japan ................................. 59-30654

[51] Int. Cl.$^4$ ......................................... H01L 21/225
[52] U.S. Cl. ........................................ 29/578; 29/571; 29/576 B; 29/576 W; 148/188; 148/DIG. 151; 148/DIG. 10
[58] Field of Search ............... 29/578, 576 W, 576 B, 29/571; 148/187, 188, DIG. 151, DIG. 167; 357/43, 34

[56] References Cited

U.S. PATENT DOCUMENTS

| 3,595,716 | 7/1971 | Kerr et al. | 29/571 |
| 3,635,772 | 1/1972 | Pestie et al. | 148/187 |
| 3,707,410 | 12/1972 | Tauchi et al. | 148/190 |
| 3,717,507 | 2/1973 | Abe | 148/186 |
| 3,756,873 | 9/1973 | Kaiser | 317/235 |
| 4,124,933 | 11/1978 | Nicholas | 29/578 |
| 4,512,075 | 4/1985 | Voka | 29/577 C |
| 4,536,950 | 8/1985 | Sadamatsu et al. | 29/578 |

OTHER PUBLICATIONS

New LSI Process Technology, Jul. 20, 1983, Kogyo Chosa Kai Publishing Company including English Translation.

Primary Examiner—Brian E. Hearn
Assistant Examiner—Tuan Quach
Attorney, Agent, or Firm—Cushman, Darby & Cushman

[57] ABSTRACT

Manufacturing of a graft-base transistor is characterized by: first, forming a layer (8) of oxide of silicon with opening on an n-semiconductor layer (2), at a part to become a base region (3, 4, 3) (FIG. 2a)); then, forming a polycrystalline silicon layer (9) and an overriding silicon nitride layer (10) with an opening (11) thereon (FIG. 2(b)); selectively diffusing P or As to form an n-emitter region (5) (FIG. 2(c)); forming a second silicon oxide layers (12, 13) only on the emitter region (5) and on peripheral regions thereabout, and removing the polycrystalline layer (9) and the silicon nitride layer (10), (FIG. 2(d)) (FIG. 2(e)); and implanting B+ ions, thereby to form deeper and higher concentration base contact regions (3, 3) and shallower and lower concentration active base region (4).

6 Claims, 7 Drawing Figures

METHOD FOR MAKING BIPOLAR TRANSISTOR HAVING A GRAFT-BASE CONFIGURATION

BACKGROUND OF THE INVENTION

1. Field of the Invention:

The present invention generally relates to a bipolar transistor, and particularly concerns an improvement in manufacturing of bipolar transistor having low base resistance and ideal graft-base configuration in the bipolar transistor.

2. Description of the Prior Art:

In order to achieve low noise and high frequency operation of bipolar transistors, as one measure of improvement, lowering of base spreading resistance has been proposed. One prior art example to achieve this is a graft-base configuration, wherein active base region is formed with low impurity concentration in order to improve carrier injection efficiency and a base contact region connecting thereto is formed with high impurity concentration, thereby to lower the base spreading resistance.

FIG. 1 shows a sectional configuration of the prior art bipolar transistor having the graft-base configuration, wherein on an n-type silicon substrate 1 of a high impurity concentration an n-type epitaxial layer 2 of a low impurity concentration is formed, and in the n-type epitaxial layer 2 p-type base contact region 3, 3 of a high impurity concentration and a p-type active base region 4 of a low impurity concentration are formed in sequence, and further, in the p-type active base region 4 of low impurity concentration an n-type emitter region 5 is formed, and finally, electrodes 6, 6" and 6' are formed on the base contact regions 3, 3 and on the emitter region 5 through openings of a silicon oxide film 7.

In the above-mentioned prior art method for manufacturing of the bipolar transistor, however, since impurity concentrations of the base contact region 3, 3 and the active base region 4 are different each other, formings of these regions 3, 3 and 4 require respective processes which require long time, many workers and much materials. Furthermore, on account of using mask resistrations in the above-mentioned two processes, gaps A between the periphery of the emitter region 5 and the periphery of the base contact region 3 becomes 2 μm, or larger. Such size of the gap is not sufficiently small for enabling lowering of base resistance, and the base spreading resistance cannot be sufficiently lowered.

SUMMARY OF THE INVENTION

Purpose of the present invention is to provide an improved method for manufacturing a bipolar transistor which can dissolve the above-mentioned problems. That is, the present invention is for providing a method whereby active base regions and a base contact region can be formed only by a single diffusion step, and furthermore, gap between the periphery of the emitter region and periphery of the base contact region can be decreased within 1 μm, thereby sufficiently decreasing the base spreading resistance.

Method for making transistor in accordance with the present invention comprises:

selectively forming a first layer of oxide of silicon on a principal face of a silicon layer of a first conductivity type to become a collector region, except on a part to become a base region, forming a layer of polycrystalline silicon and thereon a layer of silicon nitride both on all surface of the principal face, selectively removing the layer of polycrystalline silicon and the layer of silicon nitride, at the part to form an emitter region, thereby to form an opening, selectively diffusing an impurity to form an emitter through the opening, thereby to form an emitter region, forming a second layer of oxide of silicon on a surface of the emitter region, selectively oxidizing the layer of polycrystalline silicon in lateral direction underneath the layer of silicon nitride to form walls of oxide of the polycrystalline silicon around the opening, removing the layer of silicon nitride and the layer of polycrystalline silicon, and ion implanting an impurity of a second conductivity type through the principal surface into the silicon layer thereby forming a base region.

DETAILED DESCRIPTION OF THE PREFERRED EMBODIMENT

Figure 1:
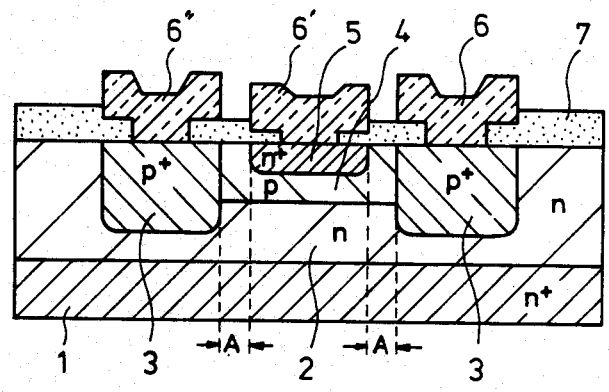
FIG. 1 is the sectional elevation view of the transistor of graft-base structure of the prior art.

The present invention is elucidated in detail with regard to a preferred embodiment of manufacturing method of bipolar transistor with reference to FIG. 2(a), FIG. 2(b), FIG. 2(c), FIG. 2(d), FIG. 2(e) and FIG. 2(f).

At first, on a principal surface of an n-conductivity type silicon substrate 1 of high impurity concentration, an n-conductivity type epitaxial layer 2 is formed to a thickness of 1 to 20 μm. And thereafter, a layer 8 of oxide of silicon is formed on a principal surface of said epitaxial layer 2 by known method, such as thermal oxidation. Then, by well-known photolithographic etching method, a part of the silicon oxide layer 8 at which a base region is to be formed, is removed. Then, a layer 9 of polycrystalline silicon and thereon a layer 10 of silicon nitride are formed as shown in FIG. 2(a).

Figure 2:
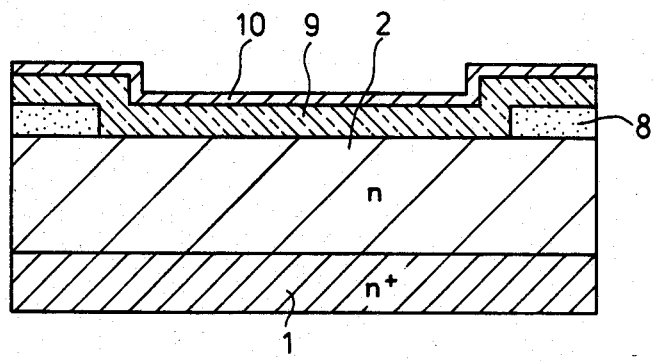
FIG. 2(a), FIG. 2(b), FIG. 2(c), FIG. 2(d), FIG. 2(e) and FIG. 2(f) are sectional elevation views showing manufacturing steps of a transistor embodying the present invention.
Figure 2:
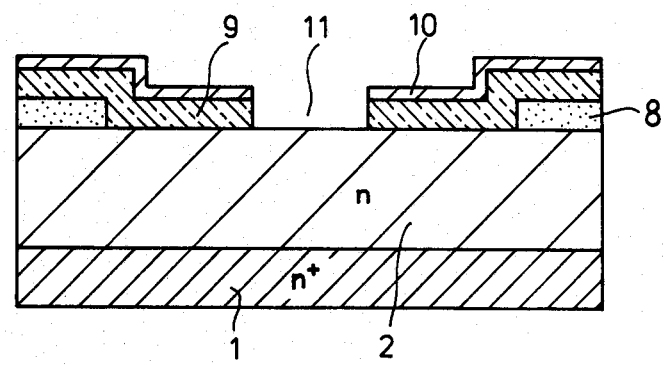
Figure 2:
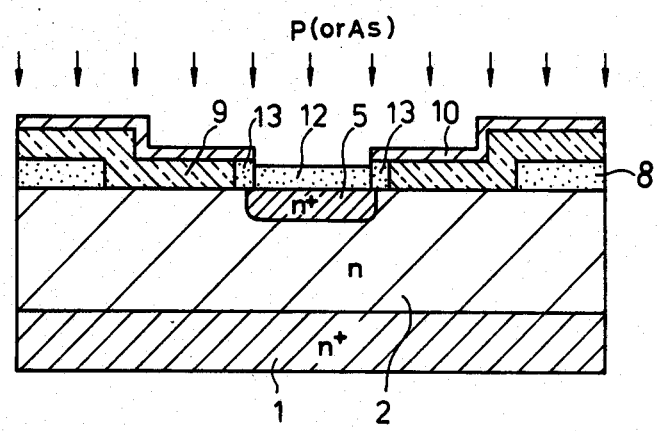

Then, by known photolithographic method, the silicon nitride layer 10 and the underlying polycrystalline silicon layer 9, which are on such a region wherein a base region is to be formed and an emitter region is to be formed, are selectively removed to form an opening 11 as shown in FIG. 2(b).

Thereafter, by ion implantations, P or As ions as impurity is implanted into the epitaxial layer 2. P or As can be diffused by known thermal diffusuion using vapor deposit ion. Then, the implanted ions are diffused in an oxidizing atmosphere. By such process, an emitter region 5 of n-conductivity type is formed, and at the same time, the vertical ends of the polycrystalline silicon layer 9 exposed under the silicon nitride layer 10 around the opening 11 are oxidized, thereby forming walls 13, 13 of oxide of silicon. And also, the surface of the emitter region 5 is oxidized thereby forming a layer 12 of oxide of silicon. In this process, since the speed of lateral oxidation of the polycrystalline silicon layer 9 is larger than the speed of diffusion of the emitter region 5 laterally underneath the polycrystalline silicon layer 9, the configuration becomes such that, the outer periphery of the wall part 13 made by the oxidation of the polycrystalline silicon layer 9 is situated outside the peripheries at the surface of the emitter region 5. The oxidation speed of the polycrystalline silicon layer 9 can be further considerably increased by adoption of high pressure oxidation method, if desired, or by adding such impurity as boron in the polycrystalline silicon layer 9. As a result of the above-mentioned manner, in a preferable embodiment, the outside boundary of the wall part 13 of the silicon oxide layer is disposed projecting outwards by 0.1 μm to 1 μm than the diffusion front at surface, i.e., periphery of the emitter region, as shown in FIG. 2(c).

Figure 2D:
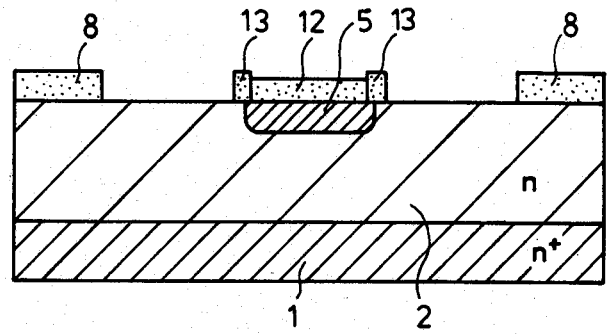

In the next step, the silicon nitride layer 10 and the polycrystalline silicon layer 9 are all removed by known method, thereby exposing the region to form the base contacts, as shown in FIG. 2(d).

Figure 2E:
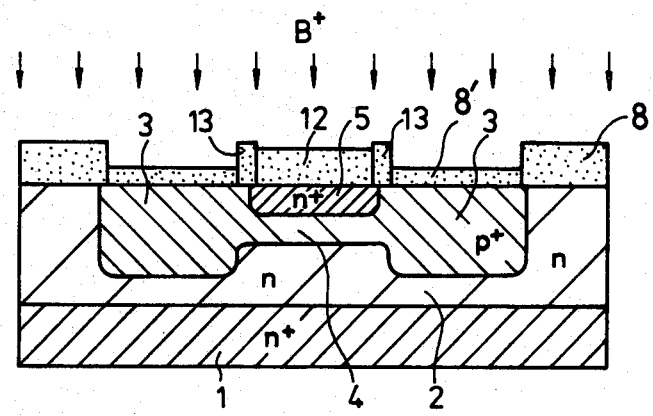

Then, boron ions B+ is ion-implanted on all over the surface of the wafer, and a thermal treatment is carried out in an oxidizing atmosphere. By this thermal treatment, base contact regions 3, 3 having a high impurity concentration of p-conductivity type and a large diffusion depth is formed in the parts where no silicon oxide layer 12 on the surface is formed; and with respect to the part above the emitter region 5 covered by the silicon oxide layers 12 and the silicon oxide walls 13, an active base region 4 having a low impurity concentration of p-conductivity type and a smaller depth than the base regions 3, 3 is formed as shown in FIG. 2(e). Also, the surface of the base contact regions 3, 3 is oxidized, thereby forming a layer 8' of oxide of silicon.

Figure 2F:
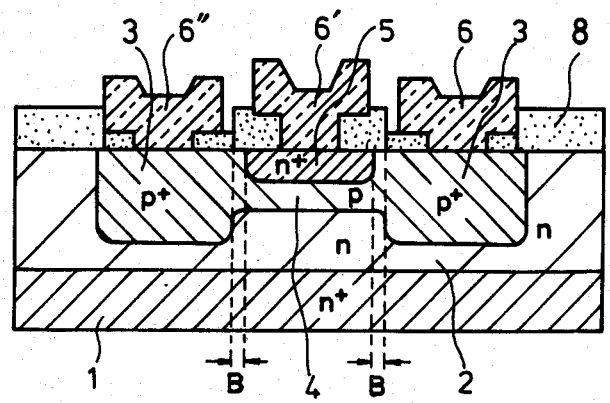

Thereafter, silicon oxide layers are selectively removed of the parts above the emitter region 5 and the base contact regions 3, 3, to expose the surface of the wafer. Then, electrodes 6', 6 and 6'' are formed respectively to contact the emitter region 5 and the base regions 3 and 3, respectively, by utilizing high impurity aluminum or aluminum containing 1 wt % silicon, thereby to complete the transistor as shown in FIG. 2(f).

The transistor manufactured in the above-mentioned step has a desirable graft configuration wherein gaps B, B between the outside periphery of the emitter region 5 and the base contact regions 3, 3 are smaller than 1 μm.

What is claimed is:

1. A method for making a transistor comprising the steps of:
   selectively forming a first layer of oxide of silicon on a principal face of a semiconductor layer of a first conductivity type to become a collector region, except on a part to become a base region,
   forming a layer of polycrystalline silicon and thereon a layer of silicon nitride both on all surface of said pricipal face,
   selectively removing said layer of polycrystalline silicon and said layer of silicon nitride, at the part to form an emitter region, thereby to form and opening,
   selectively introducing an impurity to form an emitter through said opening, therby to form an emitter region,
   forming a second layer of oxide of silicon on a surface of said emitter region,
   selectively oxidizing said layer of polycrystalline silicon in a lateral direction underneath said layer of silicon nitride to form walls of oxide of said polycrystalline silicon around said opening;
   removing said layer of silicon nitride and said layer of polycrystalline silicon; and
   ion implanting another impurity to form a base through said principal surface into said semiconductor layer thereby forming a base region.

2. Method for making transistor in accordance with claim 1, wherein
   said semiconductor layer comprises a silicon substrate and an epitaxial layer of a first conductivity type formed thereon,
   said an impurity to form the emitter is of said first conductivity type,
   said another impurity to form the base is of a second conductivity type which is opposite to said first conductivity type.

3. Method for making transistor in accordance with claim 2, wherein
   said first conductivity type is n-type and
   said second conductivity type is p-type.

4. Method for making transistor in accordance with claim 3, wherein
   said an impurity is P or As and
   said another impurity is B.

5. Method for making transistor in accordance with claim 1, 2, 3 or 4, wherein said base region is formed to comprise
   a shallower and lower concentration region due to masking by said second layer of oxide of silicon and said walls of oxide of said polycrystalline semiconductor, and
   deeper and higher concentration regions.

6. A method for making a transistor comprising the steps of:
   selectively forming a first layer of oxide of silicon on a principal face of a semiconductor layer of a first conductivity type to become a collector region, except on a part to become a base region,
   forming a layer of polycrystalline silicon and thereon a layer of silicon nitride both on all the surface of said principal face,
   selectively removing said layer of polycrystalline silicon and said layer of silicon nitride, at the part to form an emitter region, thereby to form an opening,
   selectively introducing an impurity to form an emitter through said opening, thereby to form an emitter region,
   forming a second layer of oxide of silicon on a surface of said emitter region,
   selectively oxidizing said layer of polycrystalline silicon in a lateral direction underneath said layer of silicon nitride to form walls of oxide of said polycrystalline silicon around said opening,
   removing said layer of silicon nitride and said layer of polycrystalline silicon, ion implanting another impurity to form a base region through said principal surface of the semiconductor layer into said semiconducter layer with a mask of said second layer of oxide of silicon and of said walls of oxide of said polycrystalline semiconductor; and thermal treating the whole structure as defined above, thereby said base region having a configuration of a base contact region which has a high impurity concentration and large diffusion depth, and of an active base region which has a low impurity concentration and a small diffusion depth.

* * * * *